(12) United States Patent
Vanhoutte et al.

(10) Patent No.: US 6,410,854 B1
(45) Date of Patent: Jun. 25, 2002

(54) WIRE AND SOLDER ARRANGEMENT OF EASE OF WAVE SOLDERING

(75) Inventors: Eddy W. Vanhoutte; Gilbert De Clercq, both of Bruges (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 08/752,865

(22) Filed: Nov. 20, 1996

(30) Foreign Application Priority Data

Nov. 20, 1995 (EP) ............................................. 95203166

(51) Int. Cl.⁷ ............................................... H01R 43/02
(52) U.S. Cl. ..................................................... 174/94 R
(58) Field of Search .............................. 174/94 R, 257, 174/259, 263

(56) References Cited

U.S. PATENT DOCUMENTS

| | | | | |
|---|---|---|---|---|
| 2,258,750 A | * | 10/1941 | Eichward | 174/94 R X |
| 3,541,225 A | * | 11/1970 | Raciti | 174/263 X |
| 3,693,052 A | * | 9/1972 | Galanti | 174/263 X |
| 3,770,874 A | * | 11/1973 | Krieger et al. | 174/257 |
| 3,889,364 A | * | 6/1975 | Krueger | 174/94 R X |
| 3,925,596 A | * | 12/1975 | Siden | 174/68.5 |
| 5,110,034 A | * | 5/1992 | Simmonds | 174/94 R X |
| 5,298,877 A | * | 3/1994 | Gurevich et al. | 337/164 |
| 5,328,087 A | * | 7/1994 | Nelson et al. | 228/175 |
| 5,427,865 A | * | 6/1995 | Mullen, III et al. | 428/559 |

FOREIGN PATENT DOCUMENTS

| | | | | |
|---|---|---|---|---|
| CA | 1052475 | * | 4/1979 | 174/263 X |
| EP | 0126164 | | 11/1984 | |
| FR | 1387555 | * | 12/1964 | 174/94 R X |
| JP | 4127547 | * | 4/1992 | 174/259 X |

* cited by examiner

*Primary Examiner*—Chau N. Nguyen
(74) *Attorney, Agent, or Firm*—Ernestine C. Bartlett

(57) ABSTRACT

The invention relates to an electrically conductive wire (1) comprising two spaced solder balls (2) thereon and flux (4) in the space (3) between the solder balls for making a circuit connection between electrically conductive members on opposite surfaces of a substrate. The wire (1) is inserted in a through-hole of the substrate and soldered by a customary soldering process, like wave soldering.

10 Claims, 1 Drawing Sheet

WIRE AND SOLDER ARRANGEMENT OF EASE OF WAVE SOLDERING

The invention relates to an electrically conductive wire having a solder ball thereon for making a circuit connection between electrically conductive members on opposite surfaces of a substrate by means of a soldering process.

For circuit connection across both surfaces of a substrate, a through-hole substrate is known from EP-A-0 126 164. For making the circuit connection an electrically conductive wire having a solder ball thereon is used. The wire is inserted in the through-hole of the substrate. The substrate has electrically conductive members on both surfaces and the conductive members are arranged on the perimeters of the through-hole. The solder ball on the wire is positioned on one of the conductive members. By means of a soldering process, like dipping or flow soldering, one or both ends of the wire are soldered to a conductive member at one surface of the substrate, whereas at the same time heat generated during the soldering process is transferred through the wire to the solder ball at the opposite surface of the substrate in order to melt the solder ball for making a soldering connection between the wire and the conductive member at the opposite surface of the substrate. In this way the circuit connection between the conductive members on both surfaces of the substrate is made.

In practice it has turned out that to make a circuit connection with the use of a single solder ball on it as described hereinbefore, often leads to a bad connection between the conductive members.

Therefore many manufacturers use a separate soldering robot for making such circuit connections. However, this method is rather expensive and results in a limitation in design, logistics, maintenance and process control.

The object of the invention is to provide an electrically conductive wire means for making a reliable circuit connection between electrically conductive members on opposite surfaces of a substrate.

The present invention provides an electrically conductive wire having a solder ball thereon for making a circuit connection between electrically conductive members on opposite surfaces of a substrate, characterized in that the wire comprises two spaced apart solder balls on it and flux in the space between the solder balls. Using this kind of wires for making circuit connections across both surfaces of a substrate results in a good and reliable connection. The wires are very suitable for use in an automatic soldering process, like reflow or wave soldering. The wire can be inserted in the through-hole of a substrate during the process of placing other components with the same machine. In one of the subsequent operation steps the components are soldered at their required position. At the same time the wires can be soldered in the same soldering process. So, the most important advantage is that the wires can be soldered during existing automatic soldering processes of other components. Preferably the solder balls are composed of tin, lead and bismuth instead of tin and lead only as usually used. the addition of bismuth reduces the melting temperature of the solder.

The present invention will now be described, by way of example, with reference to the accompanying drawings, wherein.

Figure 1:
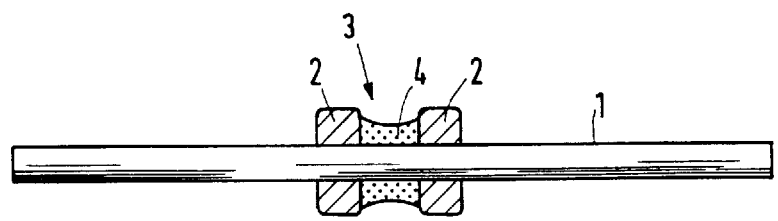
FIG. 1 shows the conductive wire.
Figure 2:
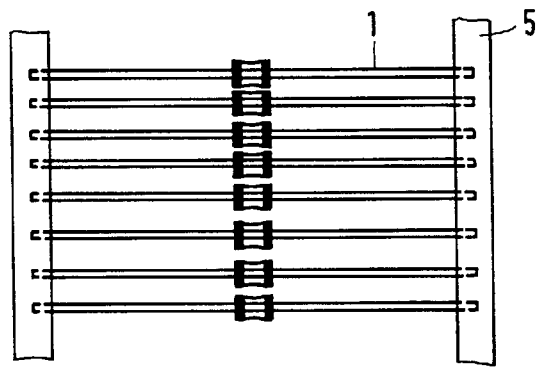
FIG. 2 shows the wires packed in a tape.
Figure 3:
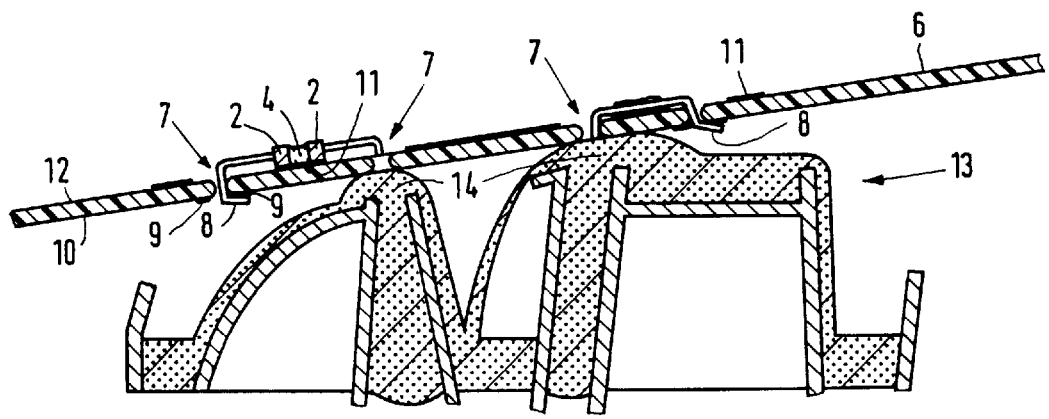
FIG. 3 shows schematically a wave soldering process for a substrate with inserted conductive wires.

The electrically conductive wire 1, usually a copper wire, is provided with two solder balls or dots 2 fixedly secured thereon. The solder balls are spaced apart. The small space 3 between the balls is filled with a flux 4. The wires can be packed in a tape 5 in well known manner (see FIG. 2) for use in a feeder of, for example, a component placement machine. In a component placement machine the wires are inserted in through-holes 7 of a substrate 6 or printed circuit board in such a manner that the ends 8 of a wire make contact with or are close to a conductive track 9 provided on one of the surfaces 10 of the substrate and the solder balls 2 with flux 4 between them make contact with or are close to a conductive track 11 provided on the opposite surface 12 of the substrate. Usually other components are also placed on the substrate as well. For electrically connecting the wires and components, the substrate is transported through, for example, a wave soldering machine 13, as shown in FIG. 3. The surface 10 of the substrate faces the hot solder 14. The hot solder touches the ends 8 of the wire 1, which are then soldered to their respective conductive tracks 9. The heat of the hot solder 14 is also transferred through the wire 1 to the solder balls 2 situated at the opposite surface 12 of the substrate. The solder balls melt and the conductive track surfaces to be wetted by solder are cleaned by means of the flux, so that a reliable connection is obtained. By using a composition of solder with tin, lead and bismuth, such as Sn43PB43Bi14, the melting temperature is reduced, resulting in a better electrical connection.

What is claimed is:

1. An apparatus comprising
   a. an electrically conductive wire;
   b. a first solder ball fixed on said wire;
   c. a second solder ball fixed on said wire, said second ball being distinct from said first ball; and
   d. flux fixed on said wire and separating said first and second solder balls;

wherein said wire further comprises a first conductive end protruding beyond said first solder ball, which end is suitable for inserting through a substrate and conducting heat, from a source to the first and second solder balls and to the flux, when the source is disposed on an opposite side of the substrate from the first and second solder balls and the flux, so that the apparatus can be soldered from said opposite side.

2. The apparatus of claim 1 wherein the wire further comprises a second conductive end protruding beyond said second solder ball, which second end is suitable for inserting through the substrate for soldering from said opposite side.

3. The apprartus of claim 2, characterized in that the solder balls (2) are composed of tin, lead and bismuth.

4. The apparatus of claim 1, wherein said first and second solder balls are each centered substantially around said wire.

5. An article of manufacture comprising
   a. an electrically conductive wire;
   b. a first solder ball fixed on said wire;
   c. a second solder ball fixed on said wire, said second ball being distinct from said first ball, said second solder ball being disposed on said wire with only a small space between said first solder ball and said second solder ball so that both of said solder balls can make contact with a single conductive contact, and so that the space therebetween can be substantially filled with flux; and
   d. said flux fixed on said wire in contact with and forming a continuous layer substantially filling the space between said first and second solder balls so that when the first and second solder balls are disposed on said single contact and heated, the solder balls flow to make a reliable connection.

6. The article of manufacture of claim 5, wherein said wire further comprises a first conductive end protruding beyond said first solder ball, which end is suitable for inserting through a substrate and conducting heat, from a source to the first and second solder balls and to the flux, when the source is disposed on an opposite side of the substrate from the first and second solder balls and the flux, so that the apparatus can be soldered from said opposite side.

7. The article of manufacture of claim 6, wherein the wire further comprises a second conductive end protruding beyond said second solder ball, which second end is suitable for inserting through the substrate for soldering from said opposite side.

8. The article of manufacture of claim 6, characterized in that the solder balls (2) are composed of tin, lead and bismuth.

9. The article of manufacture of claim 5 wherein said first and second solder balls are each centered substantially around said wire.

10. The article of manufacture of claim 5, wherein the wire between said solder balls is substantially straight.

* * * * *

UNITED STATES PATENT AND TRADEMARK OFFICE
CERTIFICATE OF CORRECTION

PATENT NO. : 6,410,854 B2
DATED : June 25, 2002
INVENTOR(S) : Vanhoutte et al.

It is certified that error appears in the above-identified patent and that said Letters Patent is hereby corrected as shown below:

Title page,
Item [*] Notice, delete "0" and insert -- 544 --.

Signed and Sealed this

Thirtieth Day of August, 2005

JON W. DUDAS
*Director of the United States Patent and Trademark Office*